(12) United States Patent
Kawase

(10) Patent No.: US 7,468,580 B2
(45) Date of Patent: Dec. 23, 2008

(54) DISPLAY DEVICE

(75) Inventor: Takeo Kawase, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 362 days.

(21) Appl. No.: 11/141,005

(22) Filed: Jun. 1, 2005

(65) Prior Publication Data

US 2005/0218791 A1     Oct. 6, 2005

Related U.S. Application Data

(62) Division of application No. 10/276,597, filed on Nov. 19, 2002, now Pat. No. 7,068,418.

(30) Foreign Application Priority Data

Jan. 31, 2001  (GB) .............................. 0102434.8
Jan. 30, 2002  (WO) ..................... PCT/GB02/00412

(51) Int. Cl.
    *H01J 1/62*    (2006.01)
(52) U.S. Cl. ...................... 313/506; 313/509
(58) Field of Classification Search .......... 313/509–512
    See application file for complete search history.

(56) References Cited

U.S. PATENT DOCUMENTS

| | | | |
|---|---|---|---|
| 5,612,549 A | 3/1997 | Nelson et al. | |
| 5,640,067 A | 6/1997 | Yamauchi et al. | |
| 5,644,327 A | 7/1997 | Onyskevych et al. | |
| 5,677,546 A | 10/1997 | Yu | |
| 5,853,905 A | 12/1998 | So et al. | |
| 5,880,705 A | 3/1999 | Onyskevych et al. | |
| 5,970,318 A | 10/1999 | Choi et al. | |
| 6,057,647 A * | 5/2000 | Kurosawa et al. | ........ 315/169.3 |
| 6,087,196 A | 7/2000 | Sturm et al. | |
| 6,259,838 B1 * | 7/2001 | Singh et al. | ................... 385/31 |
| 6,362,509 B1 | 3/2002 | Hart | |
| 6,426,595 B1 | 7/2002 | Odake et al. | |
| 6,452,218 B1 | 9/2002 | Cao | |
| 6,476,783 B2 | 11/2002 | Matthies et al. | |
| 6,498,592 B1 | 12/2002 | Mathies | |
| 6,541,919 B1 | 4/2003 | Roach et al. | |
| 6,545,291 B1 | 4/2003 | Amundson et al. | |

FOREIGN PATENT DOCUMENTS

| | | |
|---|---|---|
| EP | 0 978 880 A1 | 2/2000 |
| JP | A-61-231584 | 10/1986 |
| JP | A-63-284795 | 11/1988 |
| JP | U-01-071899 | 5/1989 |

(Continued)

*Primary Examiner*—Vip Patel
(74) *Attorney, Agent, or Firm*—Oliff & Berridge, PLC

(57) ABSTRACT

The invention provides a display device (26) including a plurality of discrete display segments (2). Each display segment (2) is provided with a drive circuit for driving the display elements arranged within the display area. The display device may be provided either as a passive, active or direct pixel addressed array. By interconnecting a number of display segments, a large area display can be achieved without the requirement for long electrodes. This reduces the electrical resistance and parasitic capacitance of the addressing electrodes, enabling the display to provide improved luminance in a displayed image and to operate at higher speeds, providing improved resolution. An active matrix addressing scheme can also be implemented using relatively low mobility organic thin film transistors.

16 Claims, 11 Drawing Sheets

FOREIGN PATENT DOCUMENTS

| | | |
|---|---|---|
| JP | A-11-126691 | 5/1999 |
| JP | A 11-510640 | 9/1999 |
| JP | A-2000-150173 | 5/2000 |
| JP | A-2000-298446 | 10/2000 |
| WO | WO 00/23976 | 4/2000 |
| WO | WO 01/17029 A1 | 3/2001 |
| WO | WO 01/27998 A2 | 4/2001 |
| WO | WO 01/61674 A2 | 8/2001 |

* cited by examiner

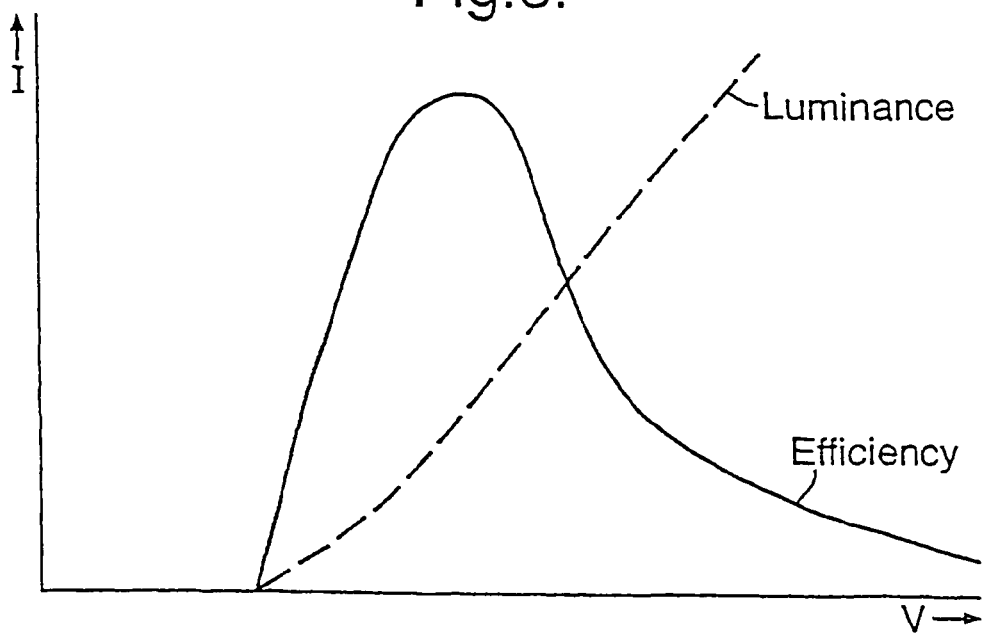
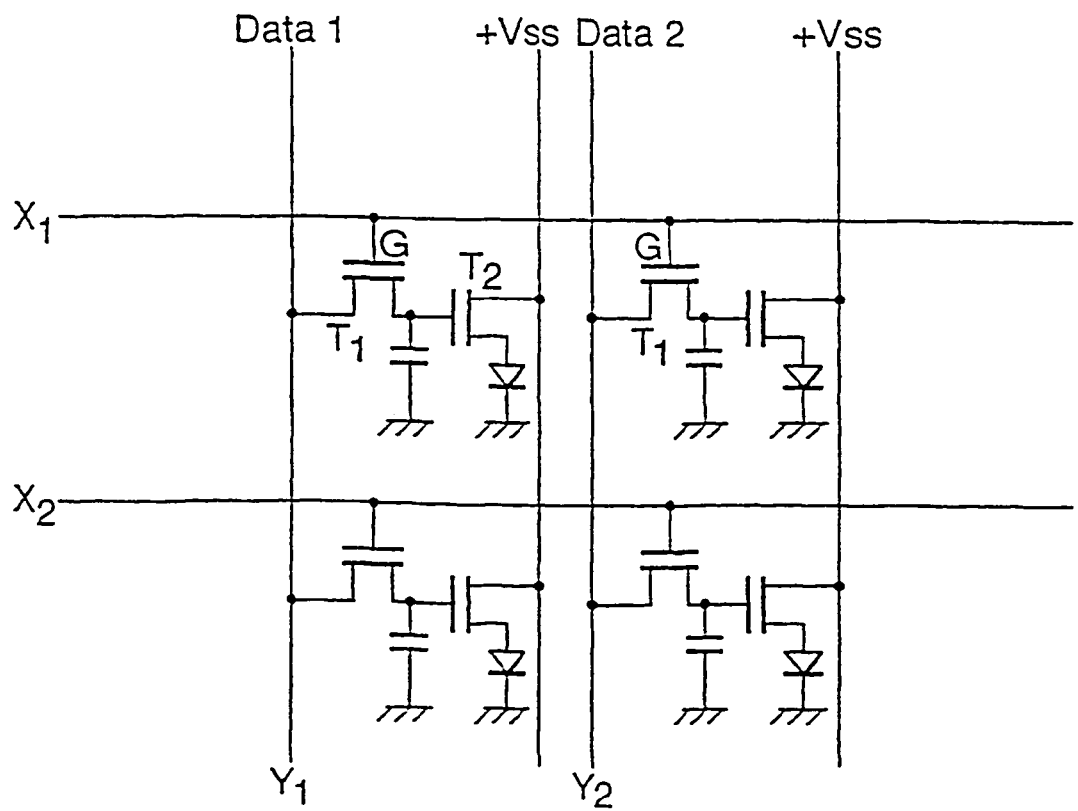

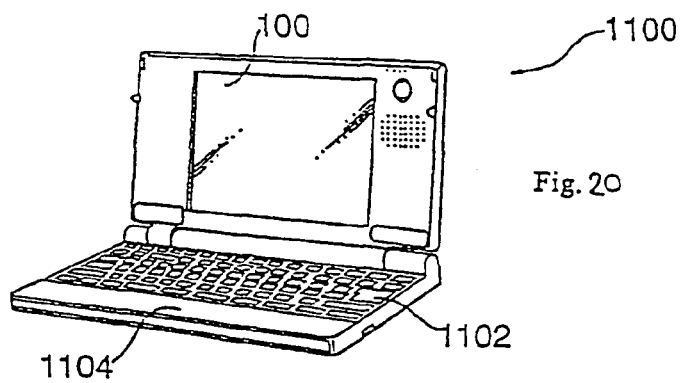
Fig. 20
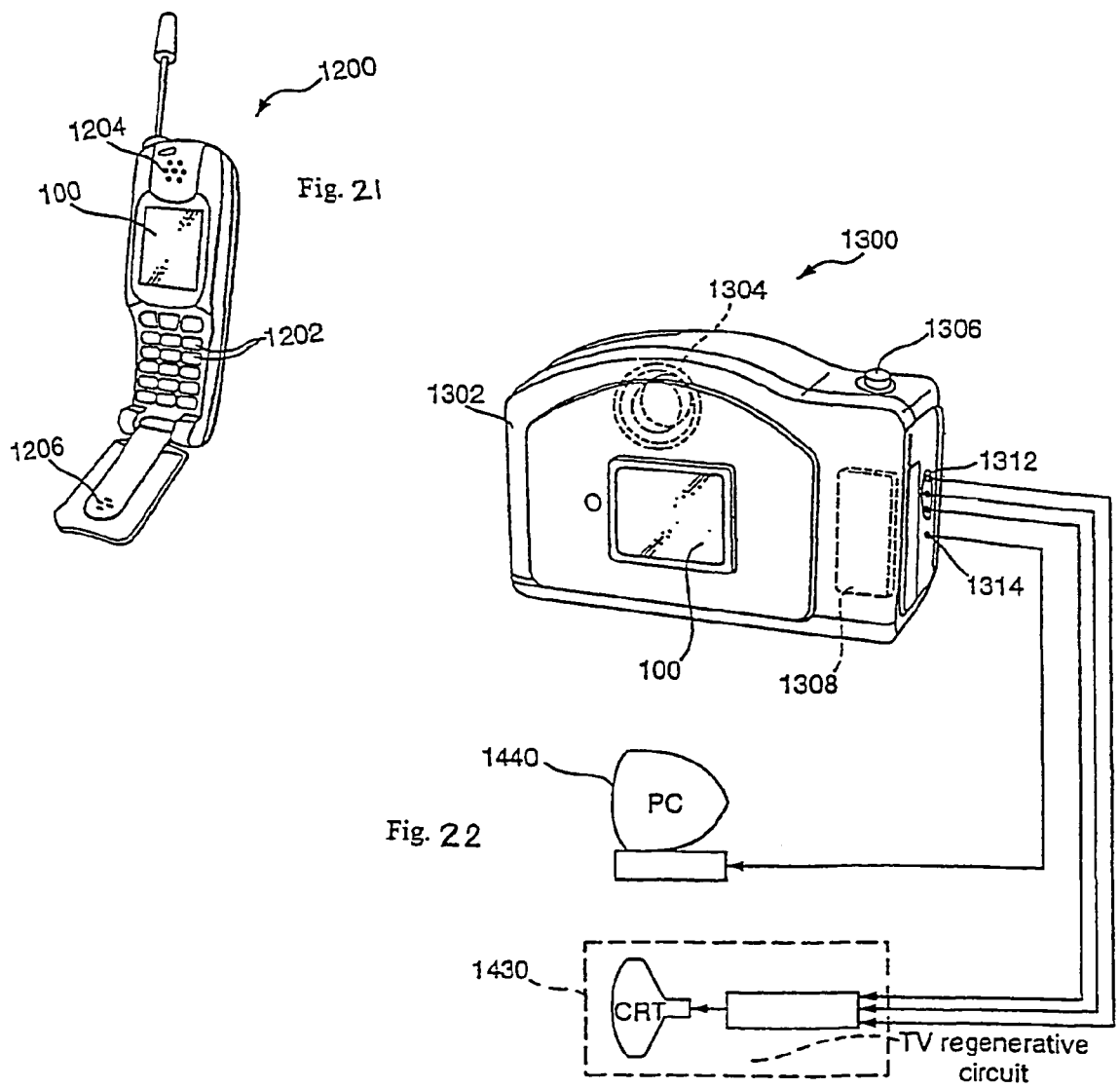
Fig. 21
Fig. 22

DISPLAY DEVICE

CROSS-REFERENCE TO RELATED APPLICATION

This is a Division of application Ser. No. 10/276,597 filed Nov. 19, 2002 now U.S. Pat. No. 7,068,418, which is a National Stage of Application No. PCT/GB02/00412, filed Jan. 30, 2002. The entire disclosure of the prior applications is hereby incorporated by reference herein in their entirety.

BACKGROUND OF THE INVENTION

1. Field of Invention

The present invention relates to display devices and, in particular, to driver arrangements for display devices.

2. Description of Related Art

A variety of display devices, such as liquid crystal displays or light emitting diode (LED) displays, are in widespread use. Recently, a further type of LED display has been proposed in the form of an addressable electroluminescent display. The electroluminescent display device comprises a mix of organic materials such as organic polymers or small molecules sandwiched between an anode and a cathode supported by a solid substrate, such as, for example, a glass, plastics or silicon substrate, the organic materials providing the light emitting elements of the display.

Organic material LED's have a much sharper response characteristic than liquid crystal display devices. The organic LED devices have very sharp 'turn on' and 'turn-off' characteristics in response to an applied current which provides such displays with improved contrast in comparison to liquid crystal displays. In addition to improved contrast, the organic materials are also considered to provide significant benefit in terms of fabrication.

For organic LED displays incorporating organic polymer materials as the light emitting pixels, the organic polymer materials may be deposited on the substrate using fabrication techniques which cannot be adopted to manufacture liquid crystal or conventional light emitting diode displays. One method which has been proposed is to deposit the organic polymer materials onto the substrate using inkjet printing in which the polymer materials are deposited as discrete drops of the material onto predisposed deposition sites provided as a matrix configuration on the substrate. The use of inkjet printing can be particularly advantageous for colour displays because the various organic polymer materials which comprise the red, green and blue LED's at each pixel of the display can be deposited in the required predefined patterns without the need for any etch process steps. In the case of small molecule type organic LED displays, shadow mask evaporation is generally applied to form the colour pixels.

Furthermore, as the active materials of the display are organic polymer materials, they may be deposited onto any suitable substrate material, including plastics materials in the form of a continuous, flexible and spoolable sheet. The characteristics of the organic polymer materials lend themselves, therefore, to the fabrication of very large area monochrome or colour display devices containing very large numbers of rows and columns of the pixels of active material making up the display area of the display device.

An organic electroluminescent display may be driven using either an active or a passive matrix addressing system. The display elements which create the light output at any pixel of the display are, in essence, provided by organic light emitting diodes. These are current driven devices, so when an active matrix addressing scheme is used to address the display to create a displayed image, two transistors per pixel of the displayed image are provided, the first to act as a switch so as to allow a data signal to be passed to a second transistor which acts as a current driver for the LED of the pixel, thereby to determine the brightness for the pixel.

A passive matrix addressing scheme is shown schematically in FIG. 1. The display element 2 shown in FIG. 1 comprises a substrate 4 supporting an array of strip-shape electrodes 6 which constitute the anode electrodes of the display element. A layer 8 of an organic photoemissive material is provided over the anode electrodes 6 and a second array of strip-shape electrodes 10, which constitute the cathode elements for the display element, are provided over the photoemissive layer 8. It can be seen from FIG. 1 that the respective arrays of anode and cathode strip-shape electrodes 6, 10 are arranged substantially orthogonal to each other. If a voltage is applied between any two of the strip-shape electrodes, a current will pass through that part of the photoemissive layer 8 arranged in the area where the two electrodes overlap. The material of the photoemissive layer behaves as a light emitting diode, and hence that part of the photoemissive layer in the overlap area of the two electrodes to which the voltage is applied will emit light. This can be seen more clearly with reference to FIG. 2.

From FIG. 2 it can be seen that the pixels of the display are each made up of an organic LED coupled between respective strip-shape anode and cathode electrodes. The strip-shape anode electrodes are, for example, decoupled from ground potential by a high impedance circuit, indicated by a value Z in FIG. 2. Data signals, indicated by voltages $V_1$ to $V_4$ in FIG. 2, are applied to the cathode electrodes of the array. At the same time, the strip-shape anode electrodes are selectively coupled directly to ground potential. Hence, for the example shown in FIG. 2, when the voltage $V_1$ is applied to the left most strip-shape cathode electrode, the organic LED $L_1$ will emit light. Likewise, when voltages $V_2$ to $V_4$ are applied to the cathode electrodes 10, the LED's $L_2$ to $L_4$ will respectively emit light.

Addressing schemes of the above type are called passive matrix schemes because there are no active elements located within the display area to drive the LED's to emit light. The light emission results purely from the data signals, in the form of voltage pulses, provided from the frame or boundary area of the display device to one of the sets of strip-shape electrodes, either the cathode or anode electrodes. However, the thin strip-shape electrodes have electrical resistance, and this electrical resistance becomes larger with increase in the length of the strip-shape electrodes. Hence, if the size of the display area of the display device is made larger, the length of the strip-shape electrodes increases and, it follows, that the electrical resistance of the strip-shape electrodes is also increased.

The displays are driven from the side edge of the display and hence, when a voltage pulse is applied to any particular electrode, the voltage actually applied to the pixels underlying that electrode will decrease with the distance of any pixel from the edge of the display to which the voltage pulse is applied due to the electrical resistance of the electrode. The potential drops along the electrodes can become significant in comparison to the LED drive voltages. It will be appreciated, therefore, that if the electrodes are relatively long, the voltage applied to a pixel located at the distal end of the electrode relative to the driven edge, will be significantly less than the voltage applied to a pixel located close to the driven edge. The brightness of the display decreases therefore with increase in distance from the driven edge and since the brightness-voltage characteristic of the LED devices is non-linear, this gives rise to non-uniform brightness of displayed image.

Additionally, the intensity of the light emitted from an LED display is a function of the peak illumination intensity of the individual LED devices and the number of lines of pixels in the actual display area of the display. This is because the LED's of the display are addressed by pulse operation in a frame period. The time period during which any LED may be addressed is known as the duty ratio and is equal to $t_f/N$, where $t_f$ is the frame period and N is the number of lines in the display. It follows, therefore, that if the number of lines in the display is increased, the duration for which any pixel may be addressed is decreased. The peak intensity of luminance from an LED occurs when it is addressed and this is averaged over the frame period. Therefore, to provide a flicker-free display, as the size of the display area is increased, and the number of lines in the display also increases to maintain resolution, the peak intensity of light emitted from the LED devices must be compensated to maintain a required output intensity for the display because it is only possible to address the LED devices for a shorter duration during a frame cycle. This can be particularly problematical for organic LED devices because of their very fast rise and decay times which means that they do not manifest an intrinsic memory characteristic.

The peak intensity of the LED devices can be increased by increasing the voltage of the pulses used to address the LED devices. It can be appreciated, therefore, that as display size, and hence the number of scan rows, is increased, relatively high voltage pulses are required to drive the LED devices at a high current density and thereby provide sufficient light output intensity from the display. This is a considerable disadvantage, as the long term reliability of the light emitting devices can be impaired and when the display is incorporated in a device powered from an internal battery supply, such as a laptop computer, larger, heavier and more expensive batteries must be used. However, the use of such relatively high voltage pulses gives rise to further problems concerning operation of the LED's.

It is known that in LED devices, the possibility of recombination of electron hole pairs, which produces the light emission, can decrease with an increase in voltage. This is because the optimum region for operation of a LED device is what is commonly known as the 'recombination zone'.

The operational characteristic of a typical LED is shown in FIG. 3, which shows how luminance and device efficiency vary in relation to the current and voltage applied to the device. It can be seen from FIG. 3 that, once a current threshold is reached, as the current passing through the device is increased, the luminance of the device also increases. However, with regard to efficiency, it can be seen that device efficiency peaks very quickly once the device starts to emit light. With further increase in voltage applied to the device, the efficiency falls quickly to a relatively low efficiency level, as shown in FIG. 3. For organic polymer LED's the peak efficiency occurs typically in the range of about 2.2V to about 5V, whereas, when the applied voltage is in the range of about 10V to 20V, the efficiency of the device has fallen back to such a low level that it becomes inefficient and impractical to use such LED's. Device efficiency is a key issue for many practical applications of LED displays as the equipment incorporating the display is frequently required to operate from an internal battery source.

This sharp decrease in device efficiency arises because, as the voltage applied between the anode and cathode for a LED is increased, the recombination zone migrates towards one of the device electrodes. Because, the shape of the recombination zone depends on the applied voltage, with passive matrix addressed displays it becomes increasingly difficult to provide sufficient display light output intensity because relatively high voltage pulses are required to drive the LED devices, which, in turn, means that the LED devices can no longer be operated in the optimum recombination zone and, therefore, at an acceptable level of efficiency.

To summarise therefore, display devices typically contain more than 200 lines in order to provide sufficient resolution in the displayed image. Therefore, the LED's have a relatively low duty ratio which is compensated by increasing the voltage applied to the LED's. However, this gives rise to lower operating efficiency of the LED's, which in turn decreases the luminance of the LED's, as shown by FIG. 5. These two operational difficulties are inter-related and compound each other and, furthermore, they increase disproportionately with an increase in the number of lines in the display.

Active matrix addressing schemes are, therefore, frequently adopted for LED displays. An exemplary active matrix addressing scheme for an organic polymer LED display device is shown in FIG. 4, which illustrates four pixels of the display device. An active matrix driving scheme includes arrays of row and column address lines shown as $X_1$ and $X_2$, $Y_1$ and $Y_2$, in FIG. 4. These address lines are in the form of thin conductive strips along which pixel selection signals and data signals can be fed to the pixels of the display device. Each pixel of the display device is provided with two transistors, shown as $T_1$ and $T_2$ in FIG. 4. Further lines are also provided along which a supply voltage $V_{ss}$ can be fed to the transistors at each pixel.

When it is desired to energise any particular pixel and so cause the LED located at that pixel to emit light, a select voltage pulse is supplied along a row address line, for example, row address line $X_1$ in FIG. 4. This voltage pulse is received by the gate electrode G of transistor $T_1$ causing transistor $T_1$ to switch ON for the duration of the voltage pulse. Assuming that the top left pixel is required to emit light, a data signal is applied to the source of transistor $T_1$ which is ON. The data signal, shown as Data 1, is passed by transistor $T_1$ to a capacitor coupled to the gate electrode of transistor $T_2$. The data signal is therefore stored as a voltage in the capacitor.

Transistor $T_1$ operates as a switch, whereas transistor $T_2$ operates as a current driver for the organic LED, which is coupled to the supply $V_{ss}$ via the transistor $T_2$. When operating as a current driver, the current at the drain of transistor $T_2$ will be a function of the magnitude of the voltage stored in the capacitor, which is proportional to the data signal, Data 1. Hence, the current flowing through the organic LED, which determines the illumination intensity of the LED, can be controlled by variation of the signal Data 1.

The data signals are arranged so that the LED's always emit light during operation of the display and, therefore, lower operating voltages can be used. Hence, the use of the driver transistors at each pixel of the display enables the LED's to be operated at lower operating voltages, and hence, much higher efficiency. FIG. 5 shows the typical operating efficiencies of LED displays when operated by active and passive matrix addressing schemes. The operating efficiency of the LED's is of paramount importance and is the primary reason why active matrix schemes are frequently adopted for LED displays. Because the driver transistors are located at each pixel of the display, they need to be fabricated over a relatively large area and, hence, thin film transistors (TFTs) are used as the driver transistors in an active matrix addressing scheme. Hence, active matrix displays are commonly referred to as TFT displays.

The two most common types of TFTs are those where the layer of semiconductor material comprises either polysilicon or amorphous silicon. More recently, TFTs have also been fabricated using organic molecules or polymers as the semiconductor layer. However, because of their higher carrier mobility, polysilicon TFTs are usually used as the driver transistors in active matrix displays for organic light-emitting diode displays. With organic active matrix displays, as two driver transistors need to be provided for each LED pixel of the display, the transistor fabrication costs are relatively high because of the complexity of the fabrication techniques which must necessarily be adopted. In particular, when polysilicon driver transistors are used, a high temperature process must be used to provide the polysilicon semiconductor layer. These increased costs, particularly when the display area is made larger, negate the cost advantages provided by the organic polymer materials. Non-uniformity of transistor performance is also an issue. Again, this is particularly problematical for large area displays, because the large number of transistor drivers must be fabricated over the larger area of the display, giving rise to increased processing concerns and a reduction in the yield of fully functional transistor devices. For this reason 'redundant' driver transistors are usually provided, further increasing the cost of the display.

As mentioned above, polysilicon has, to date, been the preferred material for TFT fabrication because of its relatively high mobility. Typically, polysilicon TFTs exhibit a mobility of between 100 to 500 cm$^2$/Vs, whereas amorphous silicon TFTs exhibit a typical mobility of 0.1 to 1 cm$^2$Vs, and organic TFTs exhibit a mobility of 0.001 to 0.1 cm$^2$/Vs. Organic LEDs are current driven devices, so in the driver circuit shown in FIG. 4, it is important to maximise the drain current provided by the transistor $T_2$.

The drain current Id of a TFT can be expressed as:

$$Id \alpha \frac{\mu W C}{L}$$

Where
  $\mu$ is the mobility of the semiconductor
  W is the width of the transistor channel region
  L is the length of the transistor channel region
  C is the capacitance of the gate Therefore, the drain current Id is proportional to the mobility of the semiconductor. Furthermore, the drain current is also proportional to the channel width but inversely proportional to the channel length. Hence, if polysilicon TFTs are used for the drive circuits, the relatively high mobility enables the footprint of the transistor structure within each pixel of the display to be minimised, which is an important consideration for polysilicon and amorphous silicon type TFTs, as both devices are opaque. Because such TFTs are fabricated using high temperature processes, they are usually formed on the rear surface of the screen (the substrate) of a display in advance of the formation of the light-emitting elements and, hence, the footprint of the TFTs will not transmit light emitted by the LEDs to a viewer of the display. The proportion of the display which is able to pass the emitted light to a viewer is known as the aperture ratio, and for relatively small size displays, such as those used in mobile telephones, an aperture ratio of about only 50% is achievable. That is, only about one-half of the available display area is able to display information to a viewer, with the remaining one-half of the display area being occupied by the opaque TFTs of the driver circuits and the conductor lines used to access the pixel located driver circuits. Even for large area displays it is difficult to achieve an aperture ratio of greater than about 70 to 80%, so the reduction of illumination efficiency arising from the use of opaque polysilicon or amorphous silicon TFTs arranged towards the front viewing side of the display is significant, irrespective of the size of the display.

It is known that organic TFTs can be fabricated from organic molecules or polymers which have a band gap providing transparency to radiation in the visible spectrum. However, such transistors have relatively low mobility and thus it has not been possible, to date, to use such organic TFTs for the active matrix drive circuit shown in FIG. 4. Displays have been demonstrated where an organic TFT has been used as the switching transistor $T_1$ but, to date, is has not been possible to use an organic TFT for the current driver transistor $T_2$ because the low mobility of the devices means the device footprint must be made so large to provide sufficient channel width to compensate for low mobility that the transistors $T_1$ and $T_2$ cannot be accommodated within the area available for each pixel of the display. Hence, the advantage of using substantially transparent TFTs for the active matrix driver circuits, which would enable aspect ratios approaching 100% to be realised, has not, thus far, been possible using the known arrangements for active matrix displays.

A further concern arises from the parasitic capacitance which exists between the driver lines to the driver transistors. In liquid crystal displays, the active liquid crystal material is located between the anode and cathode driver lines. The liquid crystal layer is usually in the range of 2 to 10 microns in thickness and, therefore, the parasitic capacitance arising between the driver line and counter common electrode is relatively small. However, for organic LED displays, the organic molecular or polymer layer is very thin, typically a few hundred nanometres in thickness. Hence, the parasitic capacitance is relatively large in comparison to LCD displays and this parasitic capacitance limits the speed at which the displays may be operated, which becomes particularly problematical as the display area increases. This is because it becomes necessary to address the display at a higher speed as the size of the display becomes larger in order to maintain the quality of the displayed image, but this gives rise to conflict because of the capacitance of the electrodes. Additionally, as the display size increases, the length, and hence the electrical resistance of the driver lines also increases, which again limits the speed at which the displays may be operated.

SUMMARY OF THE INVENTION

It can be appreciated that for large area displays, difficulties arise whether active or passive driving schemes are adopted and these difficulties become more problematical when organic or polymer LEDs are used as the display light emitting elements. For very large area displays, such as for example those used to display images in public places, it is known to combine a number of displays to provide the very large area display. However, each display making up part of such a very large area display is a separate display device. Whilst the use of a large number of display devices can reduce the length of the driver lines in comparison to an equivalent size display made up of a single display device, each display device of the large area display nevertheless includes the relatively long address lines for addressing the light emitting elements of the display. As such these display devices continue to suffer from the concerns outlined above. Therefore, there is a significant need to provide an improved type of display device in which the above concerns are alleviated.

According to a first aspect of the present invention, there is provided a display device comprising a plurality of display segments arranged on a substrate, each display segment having a display area of pixels defined by an array of display elements, and a drive circuit for driving the display elements arranged within the display area.

In a preferred arrangement, the display elements comprise organic polymer light emitting diodes.

The display elements may be arranged between a passive array of cathode electrodes and a passive array of anode electrodes, and the drive circuit comprises a first drive circuit for providing signals to the array of anode electrodes and a further drive circuit for providing signals to the array of cathode electrodes.

Alternatively, each of the display elements may include a respective drive circuit comprising a thin film switching transistor and a thin film current driver transistor, thereby to provide active matrix display segments.

Preferably, the switching transistors and the current driver transistors comprise organic or polymer transistors.

The organic molecules or polymer may be selected so that the transistors are substantially transparent to visible light.

Advantageously, the current driver transistor comprises a source and a drain region each region formed as a plurality of longitudinally extending sections joined at one end by a plurality of transversely extending sections and wherein the longitudinally extending sections of the source region are interdigitated with and spaced from the longitudinally extending sections of the drain region, thereby to provide a spacing between the interdigitated longitudinally extending sections of serpentine shape whereby the thin film transistor is provided with a channel region having a channel length equal to the width of the spacing and a channel width extending the length of the serpentine shape spacing.

Each display segment may comprise gate lines and data lines for affording control signals to the driver circuits, the gate lines and data lines comprising a conductive organic or polymer material.

The gate lines and driver lines may each comprise a bi-layer structure having a first layer comprising the conductive organic or polymer material and a further layer comprising an inorganic conductive material.

In a further embodiment, each display segment comprises a cathode electrode and an anode electrode one of the electrodes being common to all pixels of the display segment and the other of the electrodes having an electrode pattern so as to provide a respective electrode area for each pixel of the display segment and wherein the driver circuit is coupled to the anode and cathode electrodes and arranged on the opposite side of the display elements to the substrate.

In a second aspect of the invention there is provided a method for fabricating a display device comprising providing a plurality of display segments on a substrate, each having a display area of pixels defined by an array of display elements and arranging a drive circuit for driving the display elements within the display area.

The active display elements may be fabricated from an organic or polymer material which, advantageously, is deposited by an inkjet print head.

According to a third aspect of the invention there is provided a thin film transistor comprising a substrate, conductive polymer source and drain regions each formed as a plurality of longitudinally extending sections joined at one end by a plurality of transversely extending sections and wherein the longitudinally extending sections of the source region are interdigitated with and spaced from the longitudinally extending sections of the drain region thereby to provide a serpentine shaped spacing between the source and the drain regions and the thin film transistor with a channel region having a channel length equal to the channel width of the spacing and a channel width extending the length of the serpentine shape spacing.

BRIEF DESCRIPTION OF THE DRAWINGS

Embodiments of the present invention will now be described, by way of further example only, with reference to the accompanying drawings in which:

FIG. 3 is a plot showing variations of luminance and efficiency for a typical LED device;

FIG. 4 is a schematic representation of an active matrix addressing scheme for an LED display;

FIG. 20 is a schematic view of a mobile personal computer incorporating a display device according to the present invention;

FIG. 21 is a schematic view of a mobile telephone incorporating a display device according to the present invention; and FIG. 22 is a schematic view of a digital camera incorporating a display device according to the present invention.

DETAILED DESCRIPTION OF PREFERRED EMBODIMENTS

Figure 1:
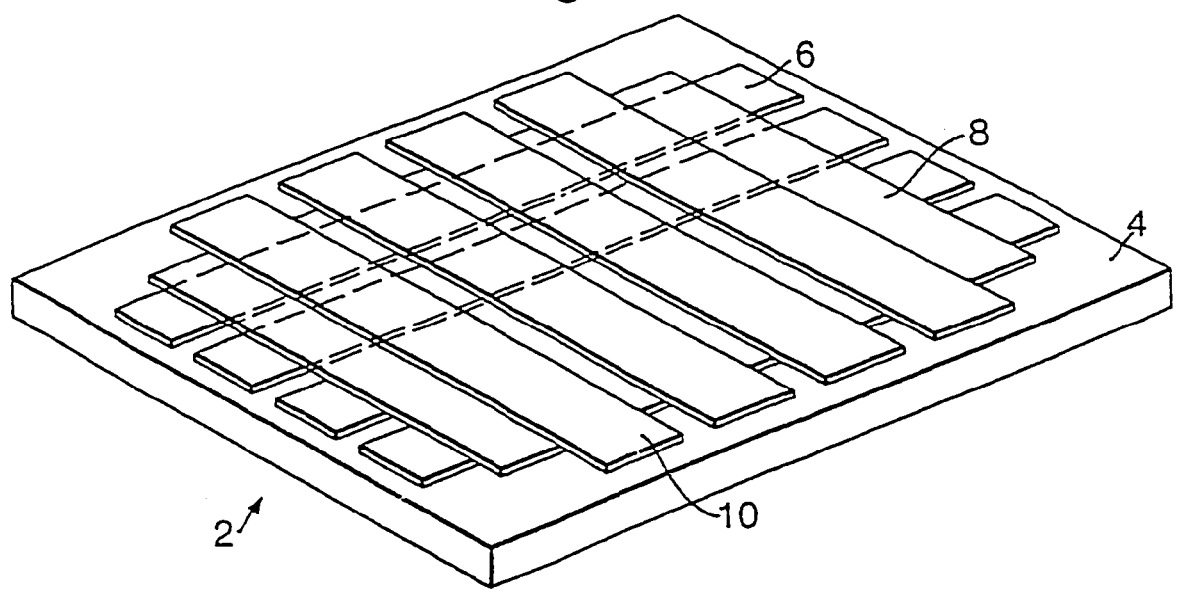
FIG. 1 is a schematic representation of a passive matrix addressing scheme for an LED display.
Figure 2:
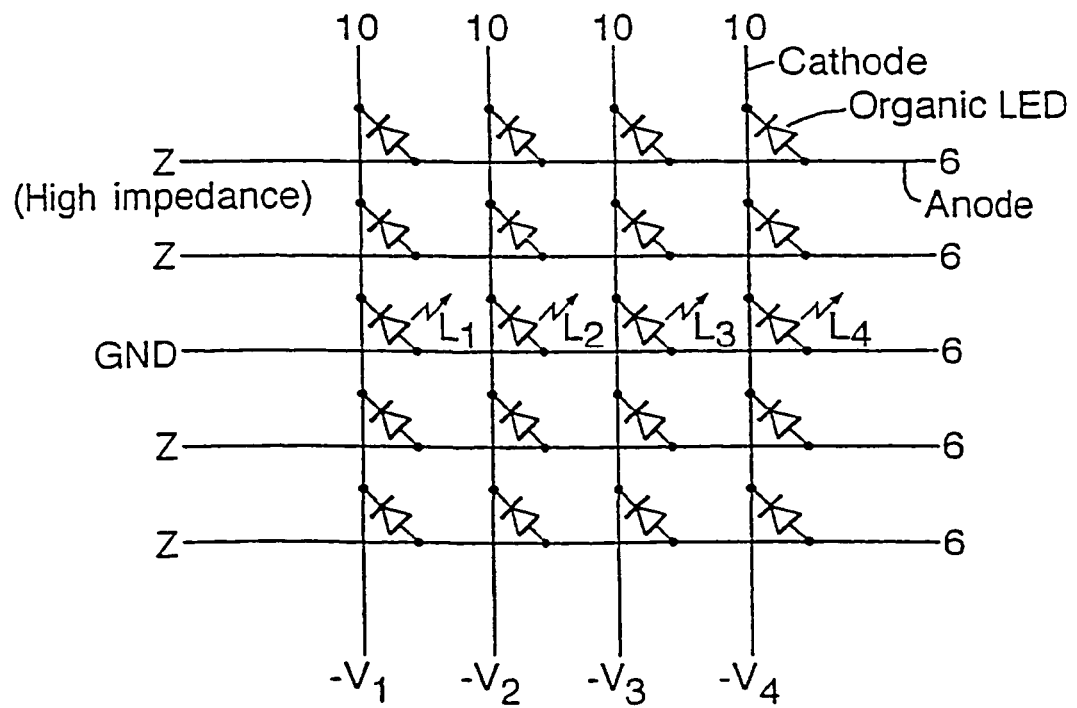
FIG. 2 is a schematic representation showing how the LED's of the display shown in FIG. 1 may be addressed.
Figure 5:
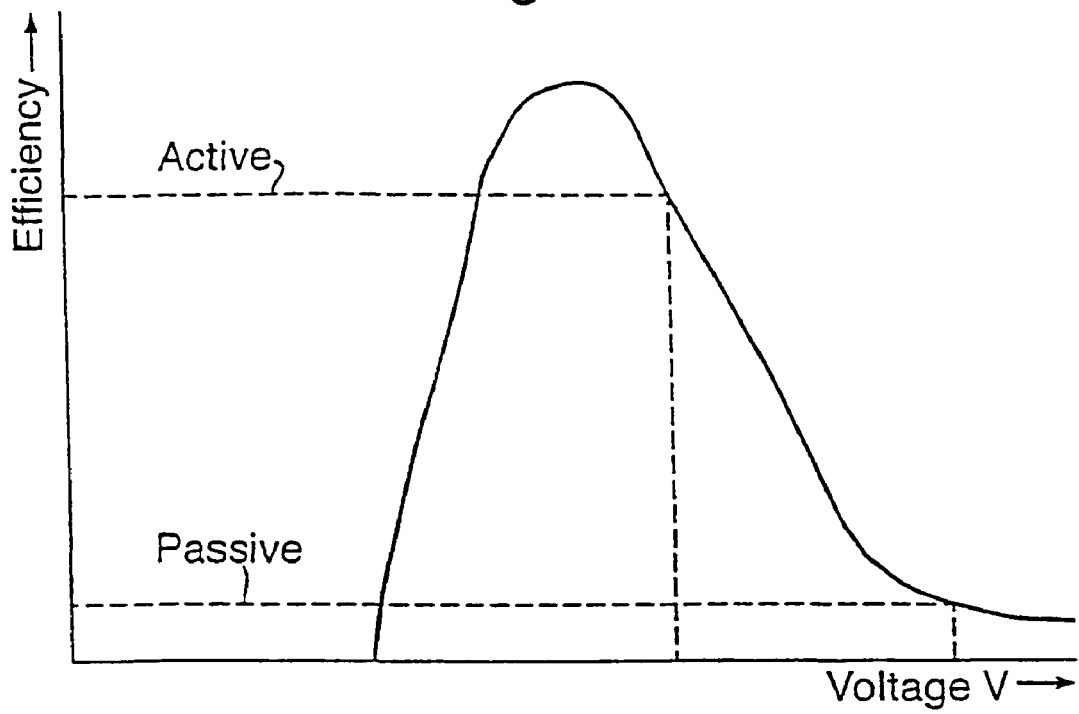
FIG. 5 is a plot showing the increase in efficiency which can be achieved by an active matrix addressing scheme in comparison to a passive matrix addressing scheme.
Figure 6:
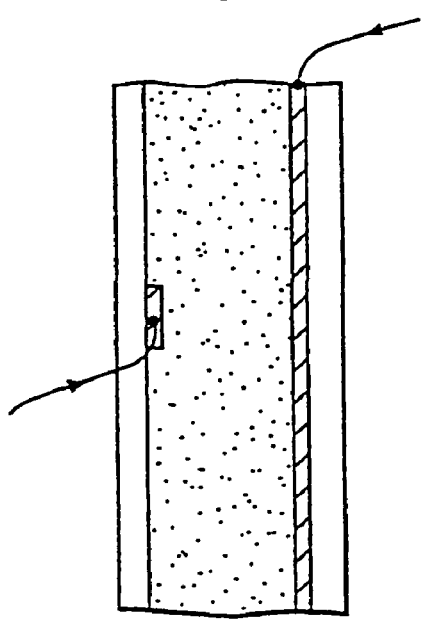
FIG. 6 is a schematic cross-sectional representation of a liquid crystal display device.

For a liquid crystal display, the liquid crystal material, being a fluid material, must be contained between a substrate and a front plate or panel for the display. Hence, the addressing lines and the driver transistors (if an active matrix is used) are located between the substrate and front plate within the liquid crystal material itself, as shown in FIG. 6. With such a construction, the liquid crystal pixels must, in practice, be driven from the edges of the display, otherwise, it becomes necessary to gain access to the addressing lines by providing holes through the front and rear panels of the display, which is not a practical proposition.

It follows that, with a liquid crystal display, as the size of the display area is increased, the length of the addressing lines will also increase, and the displays will suffer from the addressing problems described above, irrespective of whether an active or a passive matrix addressing scheme is adopted.

In an organic or polymer LED, the active organic material may comprise a polymer material or an organic small molecule type material. For a polymer material, this is deposited in liquid form but once deposited onto the substrate and dry, is a solid and relatively flexible material. Small molecule type materials are deposited by evaporation but, likewise, these are also, once deposited, solid and relatively flexible materials. Hence, for both polymer and small molecule type materials, the active organic material does not need to be retained on the substrate by the provision of the front plate, even though such a plate is provided in the finished display device to provide physical and environmental protection for the light emitting devices. Therefore, with the present invention it has been realised that the pixels which provide the picture forming elements of the display can be addressed from any position within the display, including from the rear of the display, and not just from the edge of the display. Furthermore, it has also been realised that, as the picture forming elements can be addressed from any position, the picture forming area of the display device can be sub-divided into many display segments, each provided with its own addressing scheme, giving rise to significant benefits in comparison to known arrangements for addressing schemes.

Irrespective of display size and whether an active or passive matrix addressing scheme is used, a significant improvement in display performance can be realised. If a passive matrix addressing scheme is used, the length of the driver lines to the display elements can be significantly reduced in comparison to a conventional display device as the driver lines need to extend only within a segment and not the entire length or breadth of the display. This becomes particularly advantageous for a large area display device as the large display area can be constituted by a large number of small display segments, each having relatively short length addressing lines driven and extending only within each segment. This provides reduced resistance for the driver lines and the display intensity can, therefore, be improved because, for any given size of display, lower voltage driving may be used enabling the LED devices to be operated in their optimum recombination zone, even for a large area display. Additionally, the addressing speed of the display can also be increased as there is reduced parasitic capacitance between the arrays of co-operating anode and cathode electrodes composed of the relatively short addressing lines. As will be appreciated from the above description, the division of the display into a number of small segments with drive circuits arranged within the segments provides a display with improved contrast and resolution of displayed image.

Moreover, with a conventional passive matrix addressing scheme with the display driven from a side edge, only one line of the display emits light at any one time because the lines are addressed sequentially during a frame period. In comparison, an active matrix addressing scheme is beneficial because all of the pixels are arranged to emit light at all times. However, with the driver scheme of the present invention with the driver circuits arranged in the display segments of the display area, more than one passive matrix segment can be addressed at any point in time. Hence, the segments can be arranged to emit light in a manner more akin to an active matrix addressing scheme, thereby increasing the luminance from the display.

Additionally, very large area displays can be achieved by combining a large number of display segments onto a common single substrate and as the organic or polymer material is relative flexible, such large area displays can be fabricated using a continuous batch process in which a web of spoolable plastics material is fed past various processing stations to achieve display fabrication. Therefore, the cost benefits of organic polymer displays can be more easily realised by adopting a number of display segments, each with its own addressing scheme and associated drive circuitry.

Significant benefits also arise when the present invention is used with active matrix type displays. With active matrix type displays it is still necessary to scan each line of pixels in the display at an appropriate scanning frequency. As the size of display is increased and hence the number of lines to be scanned is also increased, the scanning frequency also needs to increase to maintain the quality of displayed image. By sub-dividing the display into a number of segments, the number of lines of pixels to be scanned is effectively reduced and hence the scanning frequency can also be reduced. The active matrix addressing scheme shown in FIG. 4 contains gate lines $X_1$ and $X_2$ and data lines Data 1 and Data 2. By sub-dividing the display into display segments both the gate lines and the data lines are effectively reduced in length. Reductions in the lengths of the gate lines and the data lines are both beneficial because the lines exhibit capacitance and resistance which limit the speed at which scanning of the display pixels can be carried out. The reduction in length of the gate lines and the data lines also enables these lines to be fabricated from alternative materials, such as conductive polymers or conductive pastes containing carbons. These alternative materials provide additional benefits because the lines may be fabricated using printing techniques, such as the use of ink jet printers, without the need for expensive photolithographic or masking steps. Reduction in the scanning frequency by applying sub-divided display is particularly important when organic or polymer TFTs are used as the switching transistors $T_1$, because the time required to charge the capacitance tends to be long due to their low mobility.

Division of the display into a number of display segments also enables the use of an alternative type of addressing scheme which, in the context of the present invention, will be referred to as a "Direct Pixel Drive" scheme. With Direct Pixel Drive, the pixels in any of the display segments each can be driven directly by a drive circuit IC arranged within the display area of each segment. Direct Pixel Drive may be regarded as an alternative driving scheme lying between the conventional passive matrix scheme with overlapping arrays of anode and cathode electrodes, as shown in FIG. 7, and the conventional active matrix scheme with a switching and a driver transistor physically located at each pixel, as shown in FIG. 4.

Figure 7:
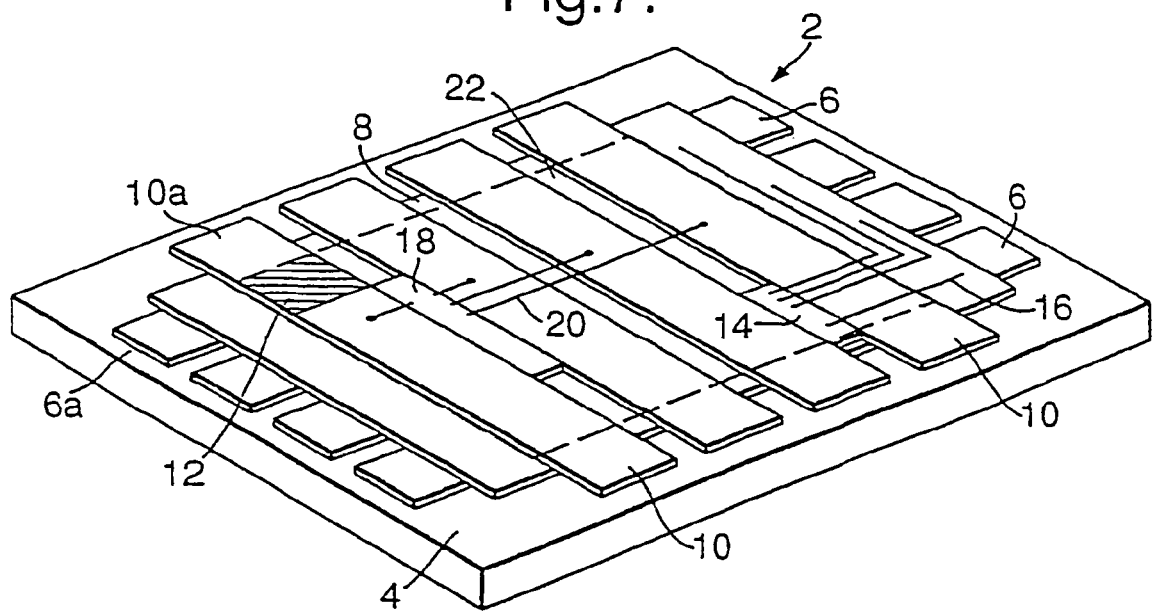
FIG. 7 is a schematic representation of a display segment of a display device according to the present invention.

Referring to FIG. 7, a display segment 2 for a passive matrix display device comprises a substrate 4 supporting an array of anode electrodes 6. A layer 8 of electroluminescent organic or polymer material is provided over the anode electrodes 6. An array of cathode electrodes 10 is provided over the layer 8. The electroluminescent polymer material may comprise a conjugated polymer including, preferably, a fluorene group. When a voltage is applied between the anode elements and the cathode elements, such as between anode element 6a and cathode element 10a, a current flows through the polymer material located in that part of the layer 8 where the elements 6a and 10a overlap, shown as shaded area 12 in FIG. 7. This causes the shaded area 12 to emit visible light and thus provide, a light emitting display element for the display. The shaded area 12 constitutes, therefore, in combination with the overlapping parts of the elements 6a and 10a, one of the pixels for the display segment.

The display segment 2 also includes a first drive circuit 14 for providing drive signals to the array of anode electrodes 6 through conductive tracks 16 and a further drive circuit 18 for providing drive signals to the array of cathode electrodes 10 via conductive tracks 20. The pixels of the segment 2 shown in FIG. 7 in combination provide a display area 22 for the segment and this is delineated in FIG. 7 by the bold dotted rectangle. It can be seen from FIG. 7 that the drive circuits 14 and 18 are arranged within this display area of the display segment. Thus, the physical lengths of the arrays of anode and cathode electrodes 6, 10, which form a passive matrix addressing system for the segment 2, can be kept to a minimum as they are addressed by drive circuits from within the segment itself.

It follows, therefore, that the electrical resistance of the electrodes as well as any parasitic capacitance which may be created between the anode and cathode electrodes, are significantly reduced in comparison to the anode and cathode electrodes of a conventionally addressed display device in which the equivalents of electrodes 6 and 10 would need to extend the entire length and breadth of the device. As described previously, this enables lower voltage drive signals to be adopted and the display elements, which constitute organic light emitting diodes, to be operated within their optimum recombination region, providing a display with much higher efficiency than known display devices.

Figure 8:
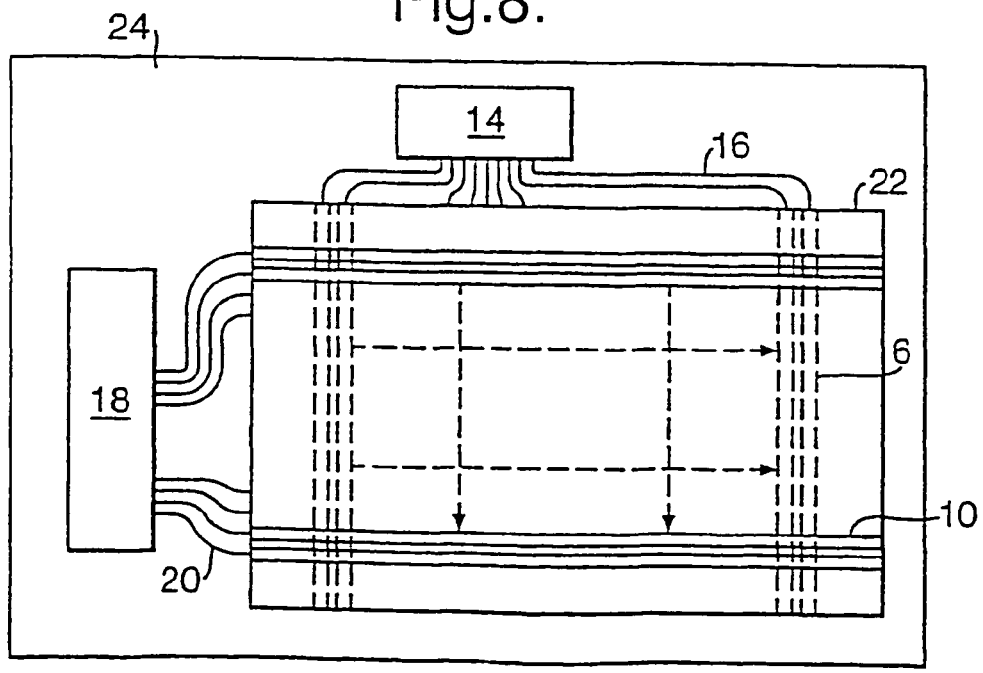
FIG. 8 is a schematic representation of a prior art display device.

FIG. 8 illustrates schematically how a prior art known passive matrix display device 24 may typically be configured. To ease explanation like reference numerals have been used in FIGS. 7 and 8 to signify the equivalent features of both devices. The display device 24 shown in FIG. 8 is not configured as a plurality or number of display segments. The display area 22 is, therefore, constituted by a single unitary display having anode and cathode electrodes 6, 10 extending the entire length and breadth of the display area of the device. As such, the anode and cathode electrodes of the display device 24 are of significantly longer length than the anode and cathode electrodes of the display segment 2 shown in FIG. 7, giving rise to the concerns as described previously. Furthermore, as will become apparent from the description following, because of their location within the active display area, the drive circuits 14 and 18 of the display segment of FIG. 7 do not require to be encapsulated prior to mounting within the display area, as effective encapsulation can be carried out at a later stage as an integral step in the fabrication of the display device. In essence, therefore, the drive circuits of FIG. 7 may be unencapsulated integrated circuit devices of very small physical size.

In contrast, the drive circuits 14 and 18 of the display device of FIG. 8 are necessarily provided as fully encapsulated integrated circuits as they are located outside of the display area and wired to the respective anode and cathode electrode arrays through respective edges of the display. Hence, the drive circuits 14 and 18 of FIG. 8 are much larger in physical size and significantly more expensive than the equivalent circuits of the display segment shown in FIG. 7, because of the encapsulation and pin configuration necessary in such devices to allow for the external wiring to the anode and cathode arrays. Therefore, it will be appreciated that by interconnecting a number of display segments 2, not only can the total display area be made larger for a given size of display device housing, because the drive circuits 14 and 18 are contained within and not at the sides of the display area, but also a lower cost, thinner or less bulky display device may be achieved as the drive circuits shown in FIG. 7 may be provided as bare unencapsulated devices which are subsequently encapsulated by the provision of a thin encapsulation layer.

Figure 9:
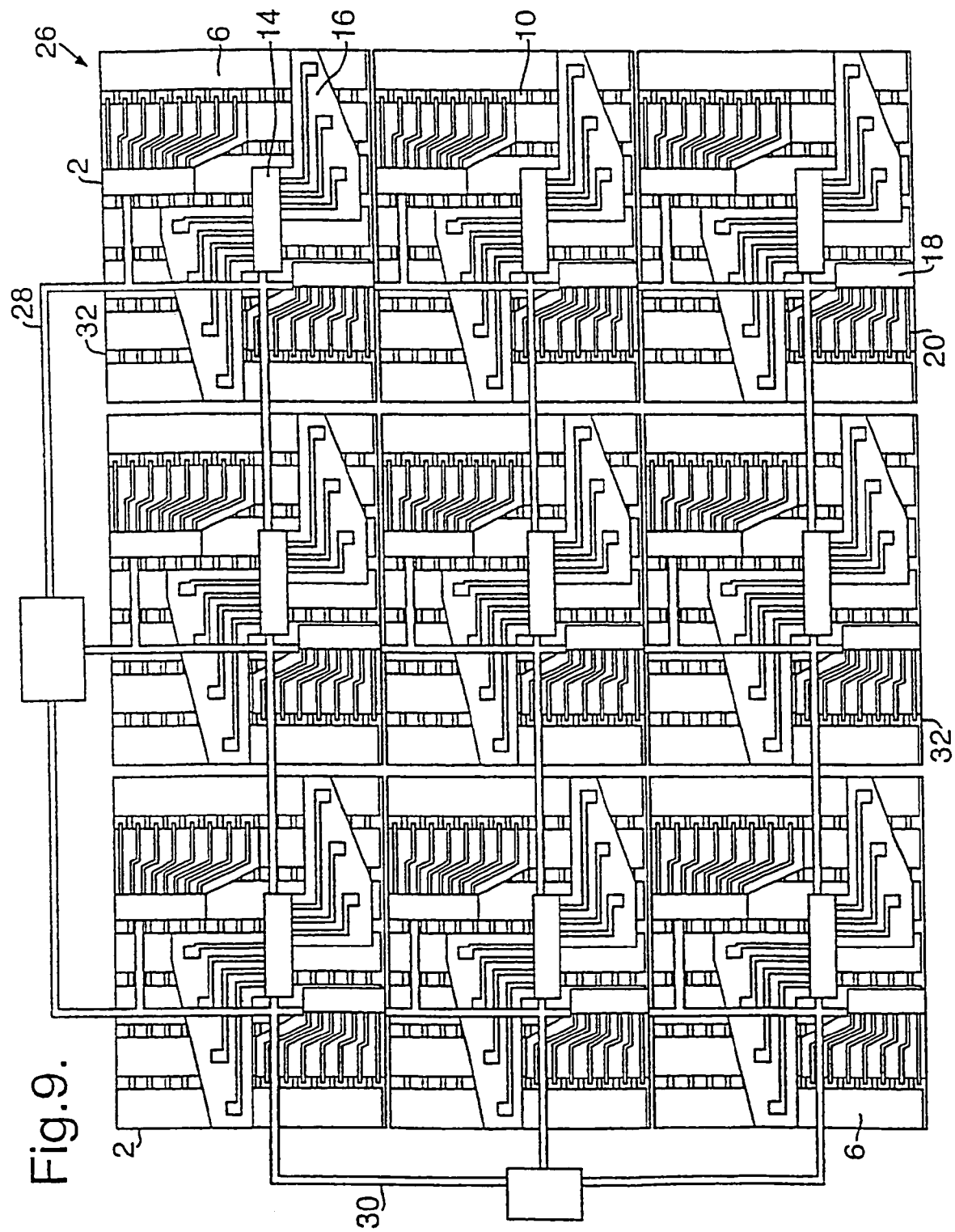
FIG. 9 shows a display device in accordance with the present invention with drive circuits mounted on the back of the display device.

FIG. 9 shows a display device 26 having a number of interconnected display segments 2. As with FIGS. 7 and 8, like reference numerals have been used to indicate like features of the display. It should be noted that FIG. 9 shows the back view of the display, so in this embodiment, the drive circuits 14 and 18 of each display segment 2 are arranged between the array of anode elements 6 and the substrate 4 which, to assist clarity, is not shown in FIG. 9.

In the display device 26, the respective drive circuits 14 for the anode electrodes 6 of display segments 2 are interconnected by interconnects 28, and the cathode electrode drive circuits 18 are interconnected by interconnects 30. These interconnects serve, therefore, to combine the display segments 2 into the unitary display device 26. As can be seen from FIG. 9, the anode and cathode electrodes 6, 10 are maintained as relatively short electrode strips, so although a large area display is provided, this is achieved without the need for relatively long anode and cathode electrodes, with their relatively high resistance and parasitic capacitance. In essence, this is made possible by effectively sub-dividing the passive addressing matrix to provide display segments, and locating the drive circuits 14, 18 within the display area of each segment. Furthermore, because the drive circuits 14, 18 are provided within each segment, the display area of the display device can be further increased to a very large size by including and interconnecting more display elements. But, once again this is achieved without the need to increase the length of the relatively short anode and cathode electrodes 6,10.

It should be appreciated that in the display device of FIG. 9, the layer 8 of emissive organic polymer material (which is not visible in FIG. 9) is disposed between the arrays of anode and cathode electrodes 6, 10. As such, the conductive tracks 20, which connect the drive circuits 18 on the rear side of the display to the cathode electrodes 10 on the front side of the display, must necessarily pass through the organic or polymer layer 8. From FIG. 9 it can be seen that the conductive tracks are arranged such that they pass through the layer 8 in spaces 32 between the anode electrodes 6 so as not to reduce the light emissive area of the display device. Also, the organic polymer layer 8 is a relatively soft material, so it is relatively easy to provide such conductive tracks from one side to the other of the layer 8 during device fabrication. Alternatively, the conductive tracks may be provided by a series of pins, which may be provided on the drive circuit 18 and which pierce through the relatively soft and thin organic polymer layer. The same is also true for the display segment shown in FIG. 7, where the anode drive circuit 14 provided on the front side of the display must be connected to the anode electrodes located under the organic polymer layer.

Figure 10:
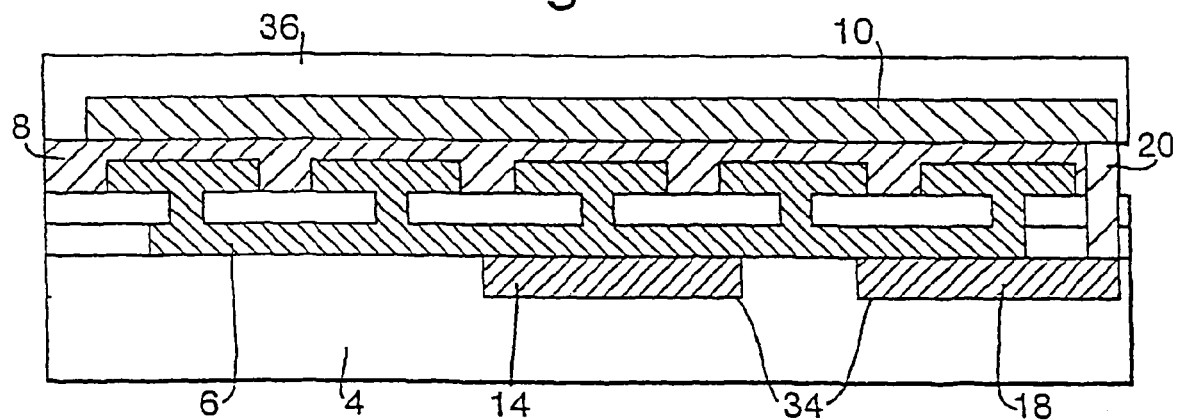
FIG. 10 shows a partial cross-sectional view of a display segment having drive circuits located within wells located on a surface of a substrate.

FIG. 10 shows a further embodiment of the invention in which the drive circuits 14, 18 are located in wells 34 provided in the substrate 4. Because the drive circuits can be provided as unencapsulated integrated circuits the wells are of relatively small size and can be produced by any convenient process, such as by wet or dry etching, laser drilling, stamping or moulding of the substrate. The drive circuits can be interconnected by suitably positioned interconnects, similar to those shown in FIG. 9.

Figure 11:
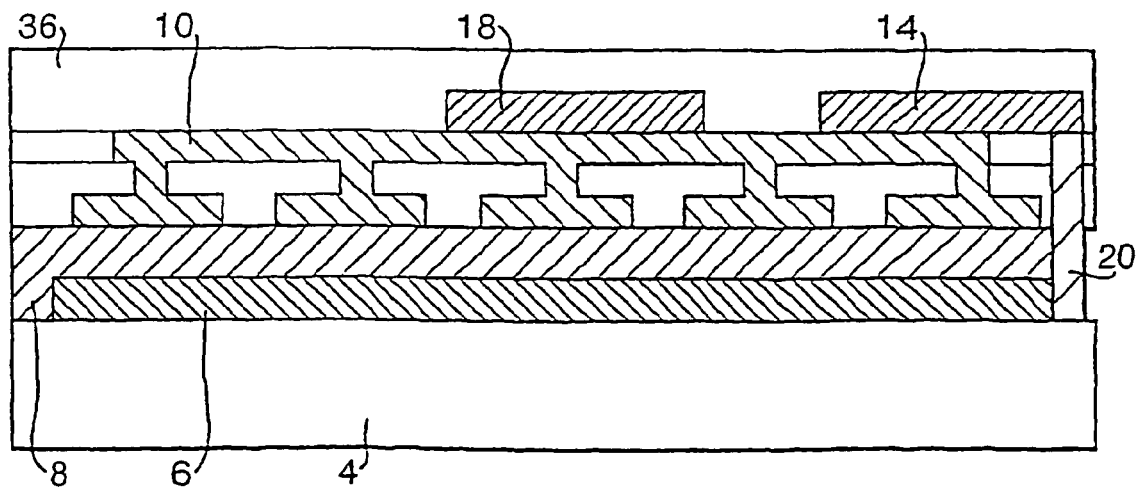
FIG. 11 shows a partial cross-sectional view of a display segment having drive circuits located on the front of the display segment.

FIG. 11 shows a partial section through the display segment 2 shown in FIG. 7 with the drive circuits 14, 18 mounted on the front side. As mentioned previously, because the drive circuits are provided within each display segment with its own passive array of anode and cathode electrodes, unencapsulated integrated circuit devices can be used for the drive circuits 14, 18, with subsequent encapsulation by a thin encapsulation layer. Such a layer 36 is shown in FIG. 10. It will be appreciated that the encapsulation layer 36 can be extremely thin in comparison to the encapsulation packages used for stand alone integrated circuits as typically used for drive circuits in prior art displays and, hence, a very thin display can be achieved by adopting the present invention.

Usually, organic polymer LED displays are fabricated with a transparent anode and an opaque cathode, such that light emission occurs through a transparent substrate, such as glass. A display device incorporating a driver circuit configuration in accordance with the present invention may be fabricated in any configuration with regard to the transparency or opacity of the anode and cathode. For example, in the configuration shown in FIG. 10, with the driver circuits 14 and 18 arranged in wells in the substrate, the anode may be made opaque and the cathode may be made transparent, in which case light emission occurs through the encapsulation layer 36. In this instance the transparent cathode may comprise, for example, a thin layer of Calcium (Ca) or Lithium Fluoride (LiF) with Indium Tin Oxide (ITO) and the opaque anode may comprise gold (Au) or platinum (Pt). Alternatively, in the configuration as shown in FIG. 11, with the driver circuits 14 and 18 arranged in overlying relationship with the cathode, the anode may be made transparent and the cathode opaque, in which case, light emission occurs through the substrate, which can also be arranged to be a transparent material. In this case, the transparent anode may comprise, for example, Indium Tin Oxide or Zinc Oxide ($Z_nO2$) and the opaque cathode may comprise a bilayer of Calcium/Aluminium (Ca/Al) or Lithium Fluoride/Aluminium (LiF/Al).

Alternatively, the transparent electrode array may be fabricated from an organic polymer, such as PEDOT or polyanilene, or a bilayer structure such as a track of ITO and an overlying track of a conductive polymer. In the latter case, the use of the overlying organic polymer can assist in the planarisation of the ITO.

The layer 8 can be deposited by any suitable process but, being an organic polymer material, it may conveniently be deposited by ejecting the polymer solution from an inkjet print head. Alternatively, the organic polymer may be deposited by spin coating. If the light emitting layer comprise a small molecule material, this may be deposited by evaporation.

The present invention has been described in FIGS. 7 to 11 with reference to a passive matrix type display but, as described above, the sub-division of the display into a number of display segments also provides benefits when used with an active matrix type display.

It is mentioned above that one of the major issues with active matrix type displays is the need to provide sufficient drive current from the current driving transistor $T_2$ in the active matrix addressing scheme shown in FIG. 4 and that, to date, this has restricted the choice of available materials to polysilicon in view of its high mobility in comparison to amorphous silicon or organic or polymer materials. As also described above, the polysilicon materials are opaque so the TFTs provided for each pixel reduce the aperture ratio of the display. However, because the scanning frequency to program the voltage of the capacitance can be reduced with the present invention, it is also possible to use transparent organic polymer TFTs for both the switching and current driver transistors of the active matrix display.

The sub-divided display of the present invention also allows a lower turn-on/off ratio in the switching transistors due to the smaller number of gate lines in each display segment. The turn-on/off ratio of organic or polymer TFTs is generally lower ($10^3 \sim 10^6$) than that of polysilicon TFTs ($10^7 \sim 10^8$). The charge in the capacitor can escape during unselected period (the off-state of the switching transistor), and that takes place more significantly when TFTs, with a low turn-on/off ratio, are used. This limits the number of gate lines or a duty ratio of the signal at the gate lines. Even with such TFTs, high resolution displays can be achieved with the sub-divided display of the present invention, because the number of the gate lines can be reduced by the segmentation.

Figure 12:
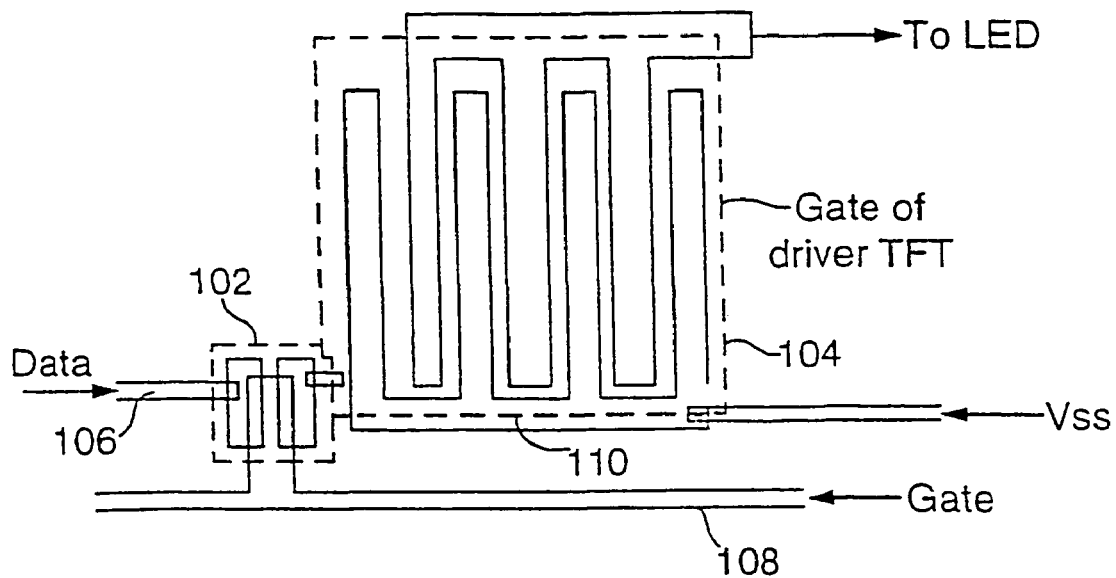
FIG. 12 is a schematic representation of an active matrix addressing scheme in accordance with the present invention.

FIG. 12 illustrates schematically an example of an active matrix addressing scheme in a display pixel according to the invention. The addressing scheme comprises a driver circuit including a thin film switching transistor 102 and a thin film current driver transistor 104, similar to the scheme shown in FIG. 4. The switching TFT 102 functions only to pass a data signal on data line 106 when enabled by a voltage supplied on a gate line 108. Because the switching TFT 102 functions merely as a pass gate, it does not have to provide a high drain current. Hence, the TFT 102 can be made of a relatively small size so that it occupies only a small proportion of an area of a pixel. Furthermore, because the TFT 102 is not required to provide a high drain current it can be fabricated from an organic or polymer material which may printed onto a supporting substrate, such as by ink jet printing.

The current driver transistor 104 is also advantageously fabricated from an organic or polymer material and this is made possible because the gate and driver lines have a relatively short length arising from the division of the display into an array of display segments. The current driver transistor at each pixel is required to maximise the drain current provided to the pixel LED from the supply $V_{ss}$, which is coupled to a source terminal of the TFT 104 via a comb-like electrode 110, as shown in FIG. 12. Because the current driver TFT is fabricated from an organic or polymer material it exhibits a relatively low mobility and hence, to compensate, the width of the channel region must be made as large as possible, and the length of the channel region must be made as short as possible to provide sufficient drain current to generate an appropriate level of light emission from the LED. The source and drain regions for the current driver TFT 104 are therefore fabricated as shown in FIG. 13.

Figure 13:
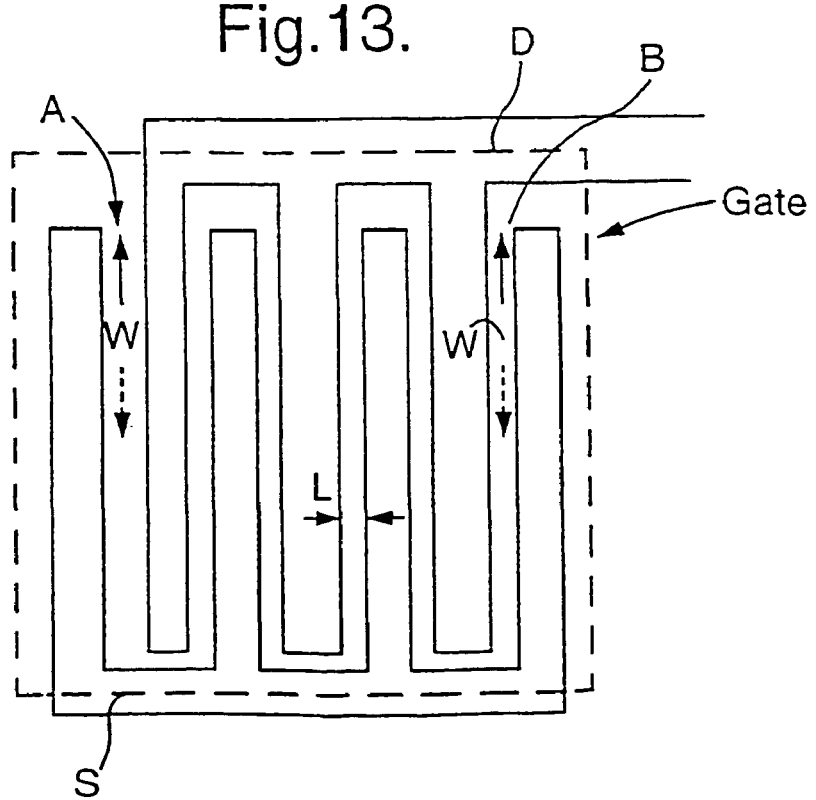
FIG. 13 is a schematic representation showing how a source, gate and drain may be configured for a driver transistor of the addressing scheme illustrated in FIG. 12.

The source region S and the drain region D are fabricated as comb-like inter-digitated regions, as shown in FIG. 13. Because the source and drain regions S, D are fabricated from a conductive polymer, the inter-digitated regions can be printed using an ink jet printing method so as to easily and reliably provide a relatively small spacing, as low as 2 to 30 microns using currently known techniques, between the source region S and the drain region D. In essence, this spacing represents the channel length of the TFT, shown as L in FIG. 13.

The channel width is provided by the length of the spacing between the inter-digitated fingers of the source region S and the inter-digitated fingers of the drain region D. This is shown as W in FIG. 13 and extends the entire length of the spacing between the respective fingers of the source region S and drain region D. By fabricating the driver transistor as shown in FIG. 13, the transistor can be provided with an extremely long channel width W, which, in essence, is limited by the size of the display element but may be provided to be in excess of 1000 microns whilst continuing to achieve good image resolution.

The drain current of a TFT is proportional to the channel width W and inversely proportional to the channel length L. Hence, if the channel width W is made very large and the channel length L is made very small, such as those provided by the structure shown in FIG. 13, it is possible for a relatively low mobility organic/polymer transistor to provide sufficiently high drain current to drive the pixel LED from the supply $V_{ss}$ if such a relatively large current driving transistor is allowed in each pixel.

Figure 14:
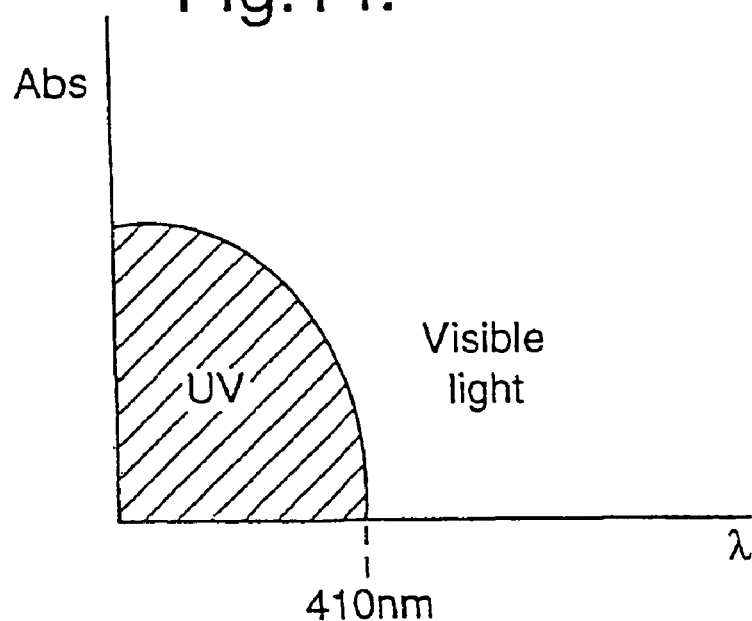
FIG. 14 is a plot showing the absorption characteristic of an organic polymer to ultraviolet and visible light.

FIG. 14 shows a plot of absorption against wavelength for an organic polymer material and it can be seen that the material is essentially transparent to radiation having a wavelength greater than 410 nanometers, i.e. visible light. Therefore, if the organic material for the switching and current driver TFTs shown in FIGS. 12 and 13 is appropriately selected, the transistors of the active matrix addressing scheme can be made substantially transparent to visible radiation and can therefore occupy the maximum space available in the pixel of the display without reducing the aperture ratio of the display. The use of an organic material having a band gap of more than three electron volts can provide this transparency in the visible light spectrum.

In such a configuration, the large area of the gate electrode 104 acts as a part of a capacitor which holds the programmed potential. Due to such large area and the small distance between the gate electrode 104 and the source 110 or the electrodes of the organic LED, the capacitance of the capacitor tends to become large. When the switching transistor is an organic/polymer transistor, it takes considerable' time to charge the capacitance up to a certain voltage, leading to a limitation of the scanning frequency. The reduction in the scanning frequency achievable with the segmented display of the present invention is also an important aspect when organic molecules or polymer are used as the channel material of the switching transistor 102.

The provision of a display as an array of display segments can provide therefore an active matrix addressing scheme having gate and data lines of reduced length in comparison to the length of the gate and data lines of an equivalent size display in the form of a single display device and this reduced length of the gate and data lines enables the scanning frequency for the display to be reduced, which in turn enables sufficient drive current for the current driven LEDs to be provided by organic/polymer type TFTs. Because organic polymer TFTs can be used, the organic material may be selected to be transparent to visible light and hence the TFTs may occupy substantially the whole of the surface area of a pixel of the display without degradation of the aperture ratio. Furthermore, because an organic/polymer may be used as the channel material of TFTs, the TFTs can be printed using a relatively straightforward low temperature process, such as ink jet printing, micro-contact printing, screen printing or photo-patterning, without the need for photolithographic or masking techniques.

Figure 15:
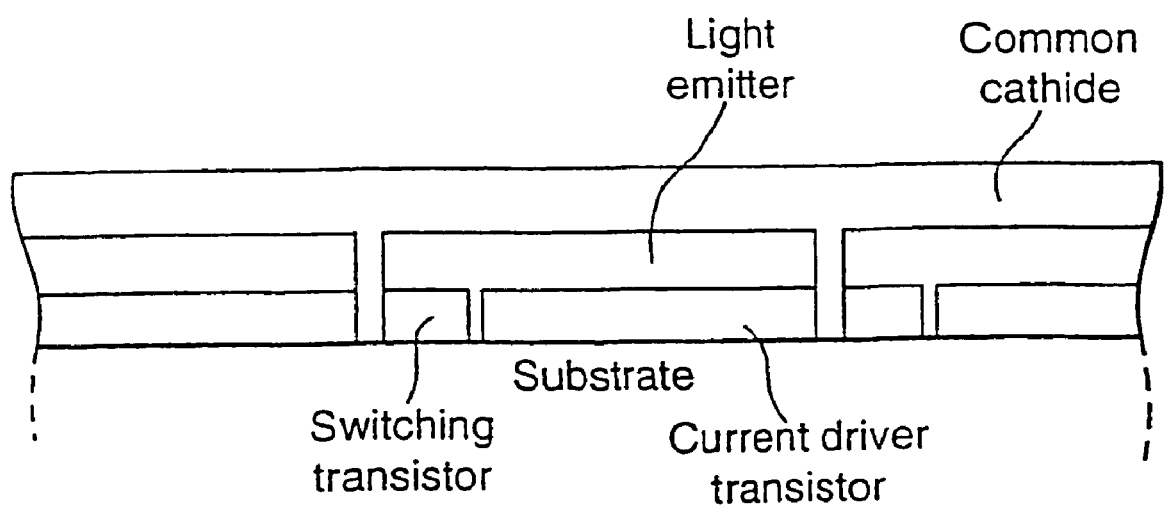
FIG. 15 is a schematic cross-sectional view of a display pixel.

FIG. 15 shows a schematic cross-sectional view through a pixel of the display in accordance with this aspect of the present invention, with the switching and current driver TFTs of the active matrix addressing scheme formed on a supporting substrate such as glass or plastic, with the light emitter region formed on the TFTs and a common cathode formed over the light emitter regions of the display pixels. Because the switching and driver transistor can be made transparent they can occupy substantially the whole of the surface area of the pixel and the light emitter region is able to emit light through the transparent transistors and the transparent substrate. Because the gate, source and drain electrodes and data lines to the active matrix driver circuit can also comprise transparent conducting polymers, the display can be fabricated entirely using a low temperature printing process and an aspect ratio of substantially 100% can be achieved, even when using an active matrix addressing scheme. Therefore, a relatively low cost but high efficiency display can be provided.

Figure 16:
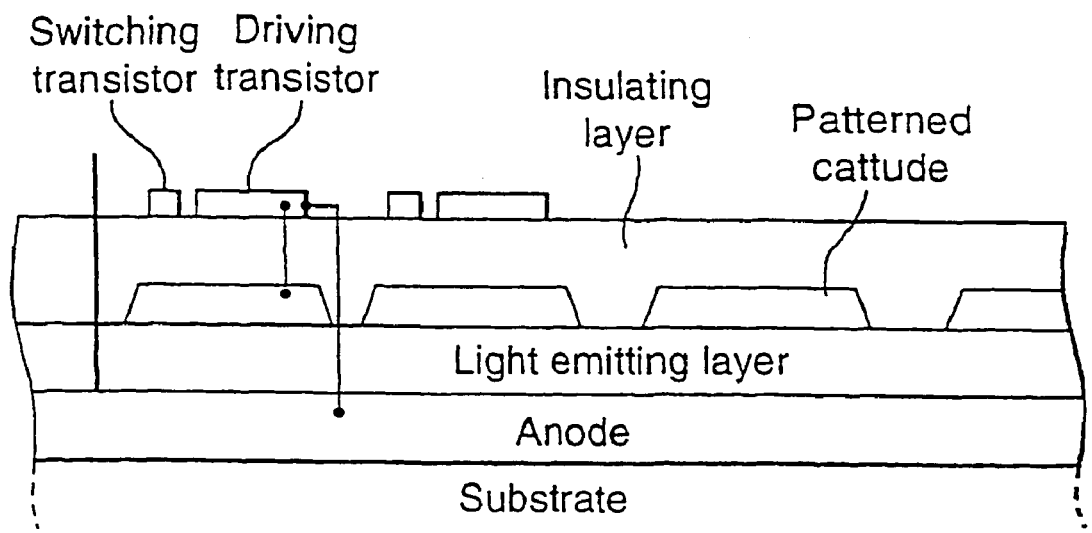
FIG. 16 is a schematic cross-sectional view of an active matrix display device.

The display can also be fabricated by providing a patterned cathode in communication with the active matrix TFTs, the patterned cathode being arranged on a common light emitting layer overlying a common anode, as shown in FIG. 16. Again, the active matrix TFTs can be fabricated by any of the printing or patterning processes referred to above so as to occupy substantially the whole of the area of each pixel. This configuration is possible only when organic/polymer TFTs are used for driving the light-emitting pixels, since organic/polymer TFTs can be fabricated with low temperature processes which do not degrade the organic/polymer light-emitting layer. When polysilicon or amorphous-silicon TFTs are fabricated, not only high temperature processes but also high energy precesses, such as plasma deposition and etching, ion implantation, W light exposure in lithography, are required. These processes destroy or degrade the organic/polymer light-emitting layer, so such TFTs are necessarily fabricated on the substrate in advance of the fabrication of the organic/polymer light-emitting layer. With the present invention, organic/polymer TFTs can be used as the transistors to drive the light-emitting pixels, and this can completely change the conventional manufacturing process of the active-matrix displays: the TFTs can be fabricated after the organic/polymer light-emitting devices are formed.

In the structure shown in FIG. 16, the switching and driver transistors are isolated from the patterned cathode by an insulator layer, which may be an insulating polymer. As such, the organic light emitting layer and the insulating layer are both relatively soft and hence it is relatively easy to provide a conductive path through to the buried common anode.

In the structure shown in FIG. 16, the TFTs are fabricated on the light-emitting devices which have the common anode and the patterned cathodes. However, TFTs can also be fabricated on light-emitting devices which have patterned anodes and a common cathode. In this case, holes in the common cathode are required to obtain conductive paths to the common anode from the top positioned TFTs.

Another important advantage of the top-TFT-structure is that the materials of the electrodes, semiconductor and insulator of the TFTs are not required to be transparent. For example, metal or metal colloid can be used as the electrodes, and higher mobility material which is not completely transparent in visible range, such as polythiophene, poly(alkylthiophene), pentacene, copolymer of fluorene and bithiophene, polythienylenevinylene, thiophene-based oligomers, or phthalocyanine, as the semiconductor. It is also possible to use n-type organic TFTs with semiconductor which has high electron mobility, such as Pc2Lu, Pc2Tm, C60/C70, TCNQ, PTCDI-Ph, TCNNQ, NTCDI, NTCDA, PTCDA, F16CuPc, NTCDI-C8F, DHF-6T, pentacene, or PTCDI-C8.

It is evident from the above description that by suitable selection of the organic or polymer material, the active matrix addressing scheme transistors can be made substantially transparent. It is also possible to select the electrode materials to be transparent, such as by the use of ITO or PEDOT for the transistor source and drain electrodes or the use of PEDOT or polyanilene for the gate electrodes.

The conductive polymer, such as PEDOT, may also be used in combination with an inorganic conductor, such as ITO, to form the source/drain electrodes and this provides additional advantages in an active matrix scheme. ITO is frequently used to fabricate the anode for passive matrix addressing schemes because it is substantially transparent but exhibits relatively high conductivity. However, ITO, when deposited, is known to exhibit relatively poor planarisation which increases the difficulty of depositing further layers, especially an insulating layer, onto the ITO deposited layer. Some p-type organic semiconductors exhibit an ionisation potential higher than 5.0 eV. When ITO is used as the electrode for such an organic or polymer type transistor, the difference in the energy levels of the ITO and organic polymer make hole injection difficult, which increases the contact resistance at the interface between the ITO electrode and the organic semiconductor.

Figure 17:
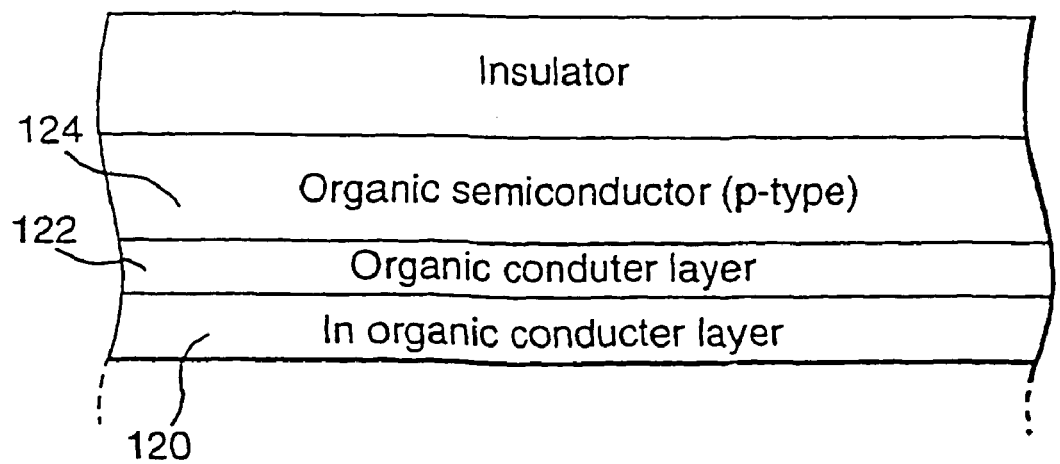
FIG. 17 is a schematic cross-section view of an organic polymer transistor.

Conductive polymers such as poly-3,4-ethlenedioxythiophene (PEDOT) or polyanilene have an ionisation potential lying between that of ITO and the organic semiconductor materials which have an ionisation potential higher than 5.0 eV. Hence, if source/drain electrodes are used which are in the form of bi-layer structures comprising a first layer of an inorganic conductor and a second layer comprising of a conductive organic polymer, and the organic semiconductor is arranged in contact with the conductive organic polymer layer to provide a structure, as shown in FIG. 17, hole injection into the semiconductor layer is made easier. For example, assuming that the inorganic conductor layer 120 is ITO, which has a Fermi level of between −4.0 eV to −4.5 eV, the organic conductor layer 122 is PEDOT which has a Fermi level of about −4.6 eV to −4.8 eV, and the organic p-type semiconductor layer 124 has the energy level of highest occupied molecular orbital of abut −5.0 eV. Because the energy gap between the ITO layer 120 and the PEDOT layer 122 is relatively small, the injection of holes from the ITO layer into the PEDOT layer is easier to achieve in comparison to hole injection directly from ITO into the organic p-type semiconductor. Similarly, because the difference in the energy bands between the organic conductor layer 122 and the p-type organic semiconductor layer 124 is also relatively small, the injection of holes from the organic conductor layer to the organic semiconductor layer is also easier to achieve. The conductivity of ITO is higher than most of the conductive polymers, leading to the high conductivity of the bi-layer electrode structure compared to that of polymeric single layer electrodes. Hence, the operational efficiency of the organic polymer transistor from a supply source of defined voltage can be improved by the use of such an inorganic/organic bi-layer electrode structure. Such bi-layer electrodes can be fabricated by etching the inorganic layer by using the patterned polymer layer as an etching mask. For example, patterned PEDOT electrodes may be deposited onto a continuous ITO layer by ink jet printing, micro-contact printing or screen printing, and this is followed by etching of ITO using an acidic etchant. Only the areas not covered with the PEDOT electrodes are etched by the etchant, resulting in the inorganic/organic bi-layer electrode structure.

This improvement in operational efficiency is an important consideration for the use of organic polymer transistors as the current driver transistors of an active matrix addressing scheme because of the relatively low inherent mobility of such semiconductor devices.

The sub-division of a display into an array of display segments provides, therefore, for a display with an active matrix-type addressing scheme, gate and data lines of reduced length, which in turn enables the use of organic polymer-type transistors to be adopted for both the switching and current driving transistors of the active matrix scheme. The organic polymer transistors may be fabricated with a low temperature process without the use of photolithographic or masking steps, such as by ink jet printing, which enables the active matrix transistors to be fabricated over the organic light emitting diodes of an organic electroluminescent display. The organic polymer materials for the active matrix transistors can be selected to be substantially transparent to visible radiation, thereby providing an improved aperture ratio for the display. Hence, a relatively efficient and relatively high quality display may be fabricated at relatively low cost by using well proven printing techniques. Due to this low temperature and low energy process for fabricating TFTs, the TFTs can be fabricated after the preparation processes of the organic/polymer light-emitting diodes.

The sub-division of the display into a number of display segments and the driving of the display pixels from a driver circuit within the display area also enables a direct pixel drive addressing scheme to be used. Examples of such a scheme are shown in FIGS. 18 and 19, where like reference numerals have been used to indicate like parts of the structures.

Figure 18:
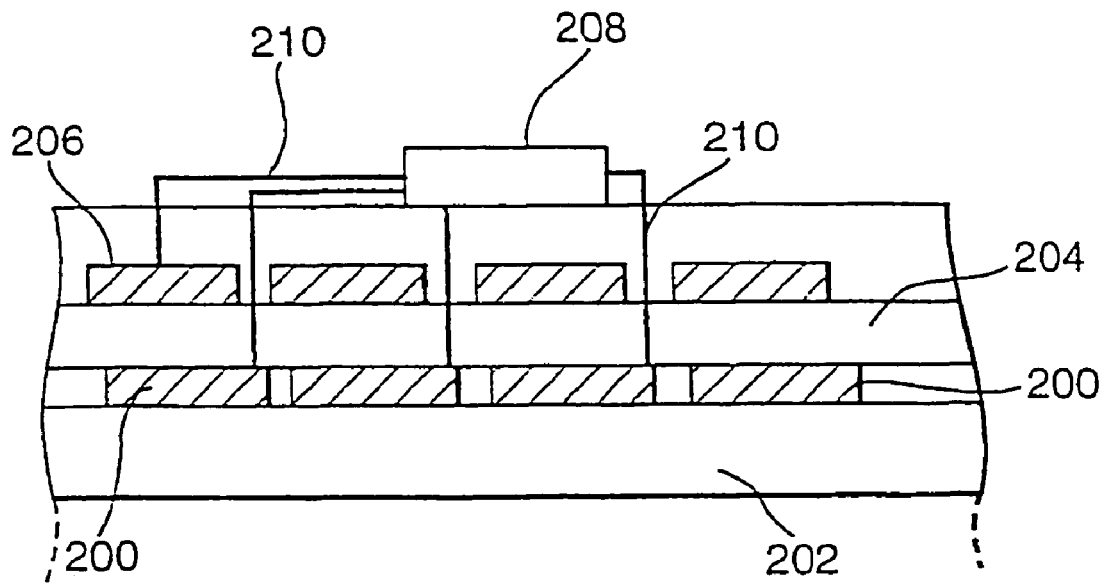
FIG. 18 is a schematic cross-section view of a direct pixel drive addressing scheme.

FIG. 18 shows a direct pixel drive addressing scheme using an array of discrete anodes 200 arranged on a transparent substrate 202. The anode pattern is arranged so that an electrode area is provided for each of the pixels of the display segment. An organic polymer light emitting layer 204 is provided over the array of discrete anodes and a common cathode 206 is provided over the light emitting layer 204. A driver IC 208 is provided to drive the pixel of the display and this is coupled to both the common cathode and the discrete anodes by electrodes 210.

The array of discrete anodes 200 are fabricated from a transparent material such as ITO or PEDOT so that the display may be viewed through the substrate. The common cathode 206, being arranged over the organic polymer light emitting layer is preferably fabricated from a conducting polymer which may be deposited by spin coating with subsequent etching of the apertures for enabling the electrodes 210 to pass through the light emitting layer to the discrete anodes.

Figure 19:
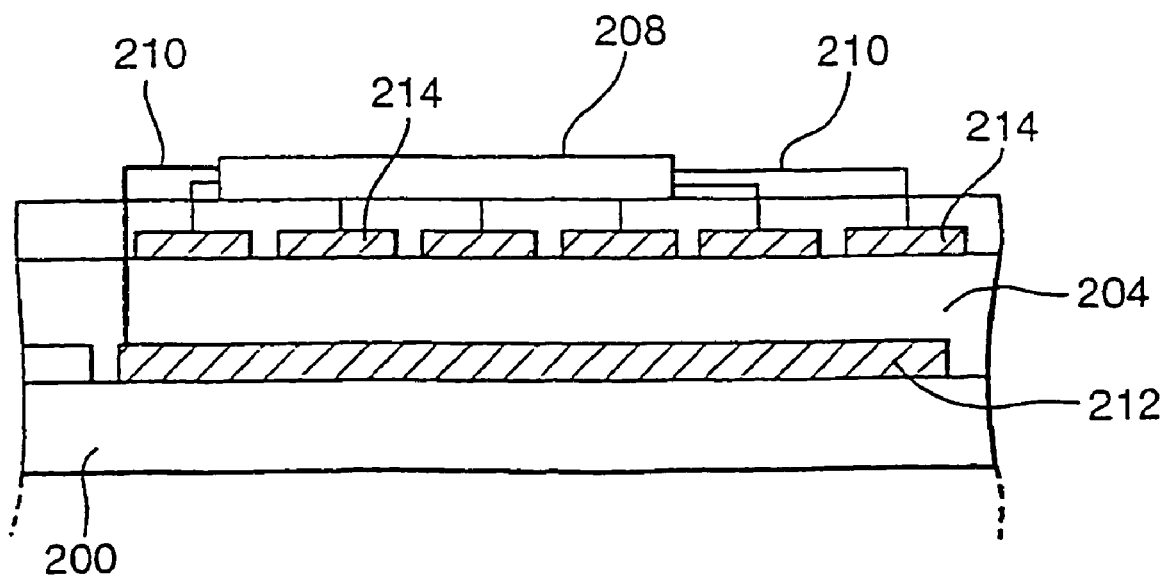
FIG. 19 is a schematic cross-section view of another embodiment of a direct pixel drive addressing scheme.

The structure shown in FIG. 19 is, in essence, similar to the structure shown in FIG. 18 except that a common anode 212 and an array of discrete cathodes are used for the display segments.

With the structures shown in FIGS. 18 and 19, a number of the display segments can be arranged in juxtaposition to provide a display device and as each display segment can be made relatively small, each can be driven a respective driver circuit, such as the driver ICs shown in FIGS. 18 and 19 arranged on the rear of the structure, and the display can be driven without the need to scan the individual rows or columns of pixels, as is the case with the generally used active or passive matrix addressing schemes.

The display device of the present invention may be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays.

Various electronic apparatuses using the above organic electroluminescent display device will now be described.

<1: Mobile Computer>

An example in which the display device according to one of the above embodiments is applied to a mobile personal computer will now be described.

FIG. 20 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the present invention, as described above.

<2: Portable Phone>

Next, an example in which the display device is applied to a display section of a portable phone will be described. FIG. 21 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device according to the present invention, as described above.

<3: Digital Still Camera>

Next, a digital still camera using an OEL display device as a finder will be described. FIG. 22 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 20, the portable phone shown in FIG. 21, and the digital still camera shown in FIG. 22, include OEL element television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above OEL device can be applied to display sections of these electronic apparatuses.

Furthermore, the display devices of the present invention is suitable for screen-type large area TV which is very thin, flexible and light. It is possible to paste such large area TV on a wall, or to hang on a wall. The flexible TV can be rolled up when it is not used.

With the present invention, a large number of display segments can be interconnected on a common substrate to form a large area display drive without the need to increase the voltage of the drive signals fed to the anode and cathode electrodes of the device or the need to increase the speed at which the pixels of the display are scanned. Hence, although the substrate 4 may be a rigid substrate, such as of glass, plastics or silicon, the present invention lends itself very favourably to the fabrication of a display device on a spoolable plastics substrate, thereby facilitating the efficient fabrication of very large area, high speed, high resolution displays with high efficiency.

The foregoing description has been given by way of example only and it will be appreciated by a person skilled in the art that modifications can be made without departing from the scope of the invention. For example, the invention has been described with reference to organic polymer LED displays but may also be used with reflective type liquid crystal displays. Furthermore, for passive matrix type displays, the driver circuits for the anode and cathode have been described as separate driver circuits. However, these driver circuits may be integrated into a unitary driver circuit, in which case both the anode and cathode may be driven by the unitary circuit. The present invention has been described with reference to an organic polymer material for use as the light emitting elements. However, small molecule materials may also be used to equal effect.

What is claimed is:

1. A display device comprising:
    a plurality of display segments disposed on one substrate, each of the plurality of display segments having a display area including display elements;
    at least one drive circuit that drives the display elements, the at least one drive circuit being arranged within the display area; and
    a first electrode and a second electrode, each of the display elements being arranged between the first electrode and the second electrode, and at least a part of the at least one drive circuit overlapping at least one of the first electrode and the second electrode.

2. The display device according to claim 1,
    the display elements including organic light emitting diodes.

3. The display device according to claim 2,
    the organic light emitting diodes including an organic polymer material.

4. The display device according to claim 1,
    further comprising:
    an encapsulation layer that encapsulates the at least one drive circuit.

5. A display device comprising:
    a plurality of display segments disposed on one substrate, each of the plurality of display segments having a display area including display elements; and
    at least one drive circuit that drives the display elements, the at least one drive circuit being arranged within the display area, at least a part of the at least one drive circuit being arranged in a well that is provided in the one substrate.

6. The display device according to claim 5,
    further comprising:
    a first array of first electrodes and a second array of second electrodes,
    the display elements being arranged between the first array of first electrodes and the second array of second electrodes.

7. The display device according to claim 5,
    each of the display elements being arranged between a first electrode and a second electrode, and
    the at least one drive circuit being arranged between the at least one of the first electrode and second electrode.

8. The display device according to claim 5,
the at least one drive circuit including a transistor,
each of the display elements being arranged between a first electrode and a second electrode, and
the transistor being connected to the at least one of the first electrode and the second electrode via a conductive track.

9. The display device according to claim 5,
each of the display elements being arranged between a cathode electrode and an anode electrode, and
the at least one drive circuit including a transistor that is connected to at least one of the cathode electrode and the anode electrode.

10. The display device according to claim 5,
a first array of the first electrodes and a second array of the second electrodes being formed for each of the plurality of display segments.

11. The display device according to claim 10,
the first array and the second array formed for one segment of the plurality of segments being electrically separated from the first arrays and the second arrays formed for the other segments of the plurality of segments.

12. A display device comprising:
a plurality of display elements;
a substrate; and
a drive circuit that drives the display elements,
each of the display elements being arranged between a first electrode and a second electrode, and
the first electrode being connected to the drive circuit, and
at least a part of the drive circuit being arranged in a well that is provided in the substrate.

13. The display device according to claim 12,
the plurality of display elements being light-emitting elements.

14. The display device according to claim 13,
the organic light emitting elements including an organic polymer material.

15. A display device comprising:
a first electrode;
a second electrode;
a display element positioned between the first electrode and the second electrode; and
a drive circuit electrically connected to the first electrode, the drive circuit being overlapped with the first electrode and the second electrode.

16. The display device according to claim 15, further comprising:
a substrate having a well in which the drive circuit is positioned.

* * * * *